United States Patent
Chen et al.

(10) Patent No.: US 7,667,384 B2
(45) Date of Patent: Feb. 23, 2010

(54) HIGH-POWERED DIODE HOLDER AND A PACKAGE THEREOF

(75) Inventors: Chih-Ming Chen, Hukou Township, Hsinchu County (TW); Wen-Lung Su, Puli Township, Nantou County (TW); Hsiang-Cheng Hsieh, Pingjhen (TW)

(73) Assignee: Lighthouse Technology Co., Ltd., Hsinchu County (TW)

( * ) Notice: Subject to any disclaimer, the term of this patent is extended or adjusted under 35 U.S.C. 154(b) by 401 days.

(21) Appl. No.: 11/641,797

(22) Filed: Dec. 20, 2006

(65) Prior Publication Data

US 2008/0116466 A1 May 22, 2008

(30) Foreign Application Priority Data

Nov. 22, 2006 (TW) .............................. 95143162 A

(51) Int. Cl.
  *H01J 1/62* (2006.01)
(52) U.S. Cl. .................. 313/500; 313/498; 257/88; 257/99; 362/249.02
(58) Field of Classification Search ......... 313/498–500; 257/88, 99; 362/249.01, 249.02
See application file for complete search history.

(56) References Cited

U.S. PATENT DOCUMENTS

| | | | | |
|---|---|---|---|---|
| 5,857,767 A | * | 1/1999 | Hochstein | 362/294 |
| 5,927,845 A | * | 7/1999 | Gustafson et al. | 362/152 |
| 6,113,248 A | * | 9/2000 | Mistopoulos et al. | 362/240 |
| 6,673,292 B1 | * | 1/2004 | Gustafson et al. | 264/149 |
| 6,812,481 B2 | * | 11/2004 | Matsumura et al. | 257/13 |
| 6,866,398 B2 | * | 3/2005 | Lin | 362/249.04 |
| 7,156,538 B2 | * | 1/2007 | Han et al. | 362/249.06 |
| 7,267,459 B2 | * | 9/2007 | Matheson | 362/362 |
| 2002/0190262 A1 | * | 12/2002 | Nitta et al. | 257/99 |
| 2004/0208210 A1 | * | 10/2004 | Inoguchi | 372/36 |
| 2006/0023451 A1 | * | 2/2006 | Han et al. | 362/249 |

* cited by examiner

*Primary Examiner*—Bumsuk Won
(74) *Attorney, Agent, or Firm*—Rosenberg, Klein & Lee

(57) ABSTRACT

A high-powered diode holder and a package thereof are disclosed. The high-powered diode holder includes a base and a plurality of metal electrodes. The base is made of ceramic. In the interior part of one end of the base, there is a functional area that is indented inwards. In the functional area, there are a plurality of through-hole units and a plurality of conducting areas whose polarities are different. The second end of the base is connected with a heat-conducting base. The metal electrodes are individually connected with the base, and the metal electrodes are electrically connected with the corresponding conducting areas respectively. In the functional area, there are a plurality of LED chips that correspond to the through-hole units respectively. The LED chips and the conducting areas are connected with conducting-wires respectively, and a package resin element covers the functional areas of the base.

15 Claims, 9 Drawing Sheets

HIGH-POWERED DIODE HOLDER AND A PACKAGE THEREOF

BACKGROUND OF THE INVENTION

1. Field of the Invention

The present invention relates to a light emitting diode. In particular, this invention relates to a high-powered diode holder and a package thereof that is heatproof, durable, and opaque.

2. Description of the Related Art

Recently, light emitting diodes have been increasingly applied to flashlights, traffic signs, advertising billboards, cell phones, light sources for liquid crystal displays or liquid crystal TVs. For liquid crystal displays or liquid crystal TVs, a lot of LEDs are needed. There LEDs generate a large amount of heat. Although the heat generated from the LEDs is far lower than the heat generated from transitional lamps, the usage life of the LEDs is reduced, and the LEDs can fail or cause a light-exhaustion symptom if the heat cannot be exhausted. If this does occur, liquid crystal displays or liquid crystal TVs will suffer dark points or have light-unbalanced symptoms. It is therefore important to conduct heat from the LEDs.

Reference is made to FIGS. 1 and 2, which show a package of LEDs of the prior art. The package of the LEDs has a frame-shaped resin 11 that is fastened with a heat-conducting base 12, and two supporting frames 13. The supporting frames 13 are disposed along the sides of the heat-conducting base 12 to form conducting areas 131. A plurality of LED chips 14 are disposed on the heat-conducting base 12. The LED chips are connected to the conducting areas 131 via two conducting-wires 141. A package resin 15 is covered by the resin 11. The voltage is exerted to the supporting frames 13, and is conducted to the conducting area 131 via the conducting-wires 141 to light the LED chips. At the same time, the heat generated from the LED chips 14 can be exhausted to the outside of the resin 11 via the heat-conducting base 12.

However, because the electronic manufacturer wants to make the liquid crystal displays or liquid crystal TVs thinner and lighter to reduce the required space and create a beautiful appearance, all components have to be reduced in size. In the package structure for LEDs of the prior art, the resin 11 is a heat-molding resin, such as polyphthalamide—PPA. The thickness of the resin 11 has to be larger than a specified thickness to prevent the light of LED chips from passing through the resin 11. The heatproof and durable characteristics of the resin 11 are also inadequate. For example, high temperatures cause the resin to deteriorate. The resin 11 may become damaged before user life of the LED chips 14 is passed (the life of the LED chips is more than one hundred thousand hours).

Moreover, when the described LED packages are installed in electronic products, such as liquid crystal displays or liquid crystal TVs, the LED packages are disposed on an electric board (not shown in the figure) at an equal distance. The LED chip 14 in a resin 11 has a larger distance with a LED chip 14 of an adjacent resin 11. Light spots will be generated at equal distances. The brightness of the area of the light spots is dark. The brightness of the liquid crystal displays or liquid crystal TVs therefore becomes unbalanced.

SUMMARY OF THE INVENTION

One particular aspect of the present invention is to provide a high-powered diode holder and a package thereof that is heatproof, durable, and opaque. It prevents the package from becoming damaged due to high temperature. The LED package is thinner, and light-leakage is avoided.

A further particular aspect of the present invention is to provide a high-powered diode package assembly that prevents the light-spots from occurring. The brightness is balanced.

The high-powered diode holder includes a base, and a plurality of metal electrodes. The base is made of ceramic. In the interior of one end of the base, there is a functional area that is indented inwards. In the functional area, there are a plurality of through-hole units and a plurality of conducting areas whose polarities are different. The second end of the base is connected with a heat-conducting base. The metal electrodes are individually connected with the base, and the metal electrodes are electrically connected with the corresponding conducting areas respectively.

In the functional area of the base, there is a plurality of LED chips that correspond to the through-hole units respectively. The LED chips and the conducting areas are connected with conducting-wires respectively, and a package resin covers the functional areas of the base.

The present invention also provides a high-powered diode package assembly that includes a plurality of LED packages that are connected together in series. The LED package includes a base, two metal electrodes, a plurality of LED chips, and a package resin element. The base is rectangular and is made of ceramic. In the interior of one end of the base, there is a functional area that is indented inwards. In the functional area, there are a plurality of through-hole units and a plurality of conducting areas whose polarities are different. The second end of the base is connected with a heat-conducting base. The two metal electrodes are connected with two sides of the base, and the metal electrodes are electrically connected with the corresponding conducting areas respectively. The LED chips are located in the functional area of the base that corresponds to the through-hole units respectively. The LED chips and the conducting areas are connected with conducting-wires respectively. The package resin element is connected with the functional area of the base, and covers the LED chips. A metal electrode of one LED package is adjacent to a metal electrode of another LED package.

The present invention has the following characteristics:

1. The base is made of a ceramic that is heatproof, durable, and opaque. It will not deteriorate due to high temperature. It is thinner and prevents light from leaking out.

2. The structure of the through-hole and heat-conducting base makes the LED chips conduct heat well.

3. The structure wherein the LED packages are connected in serial shortens the distance between two adjacent LED packages to prevent the light-spots from occurring. The total brightness is balanced.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
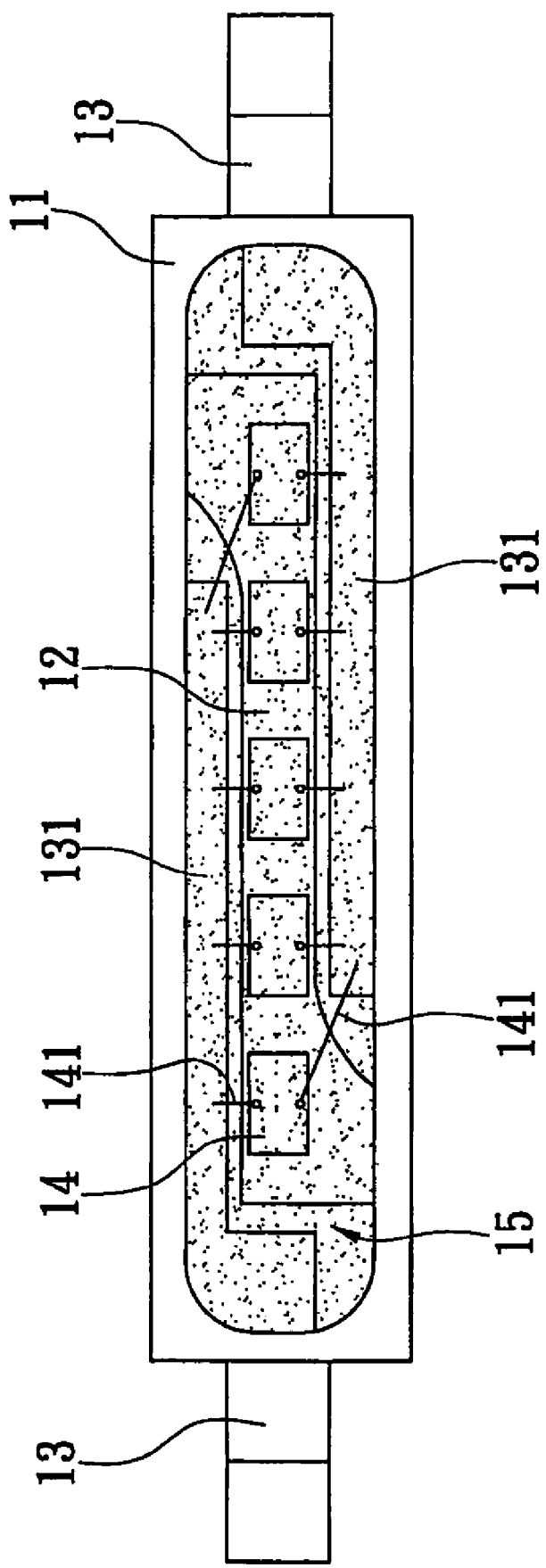
FIG. 1 is a top view of the LED package of the prior art.
Figure 2:
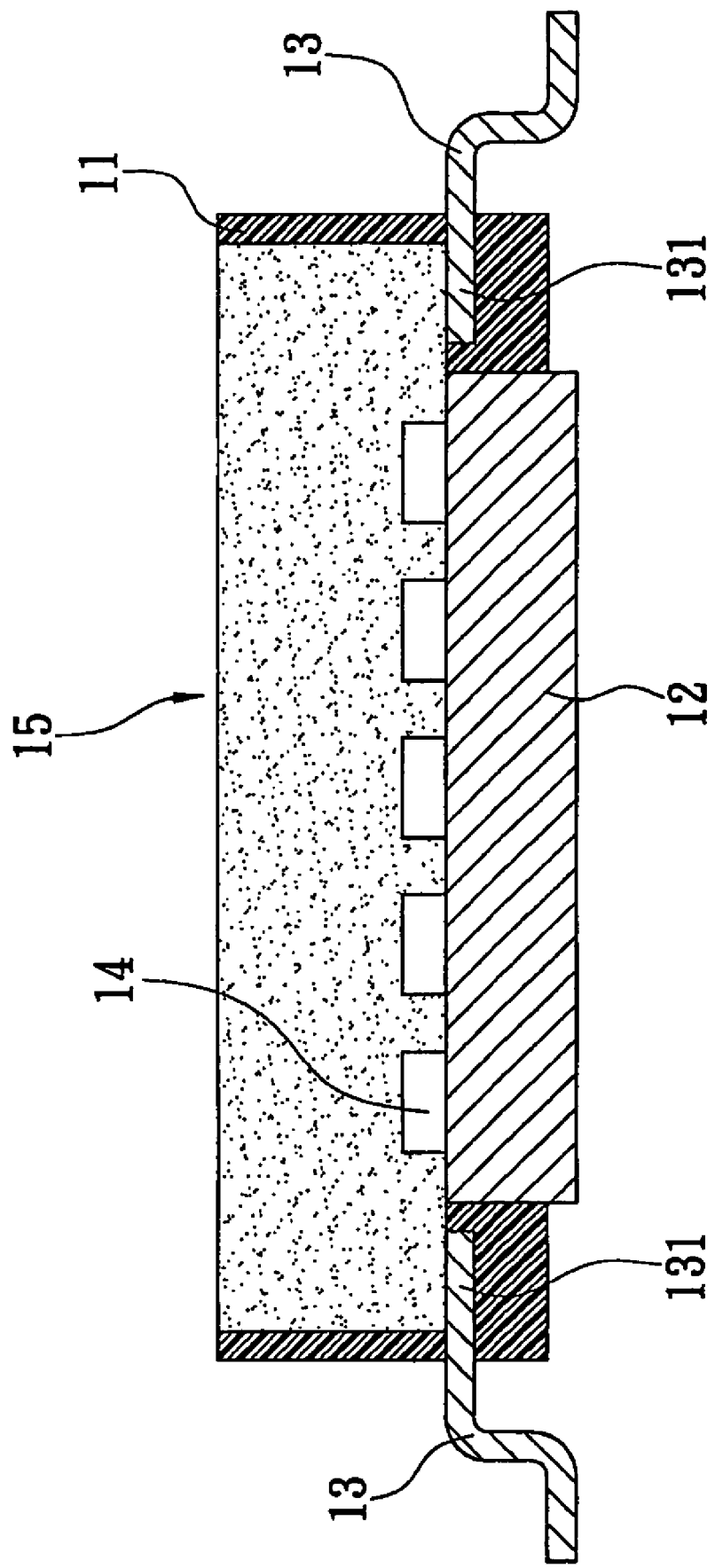
FIG. 2 is a cross-sectional view of the LED package of the prior art.
Figure 3:
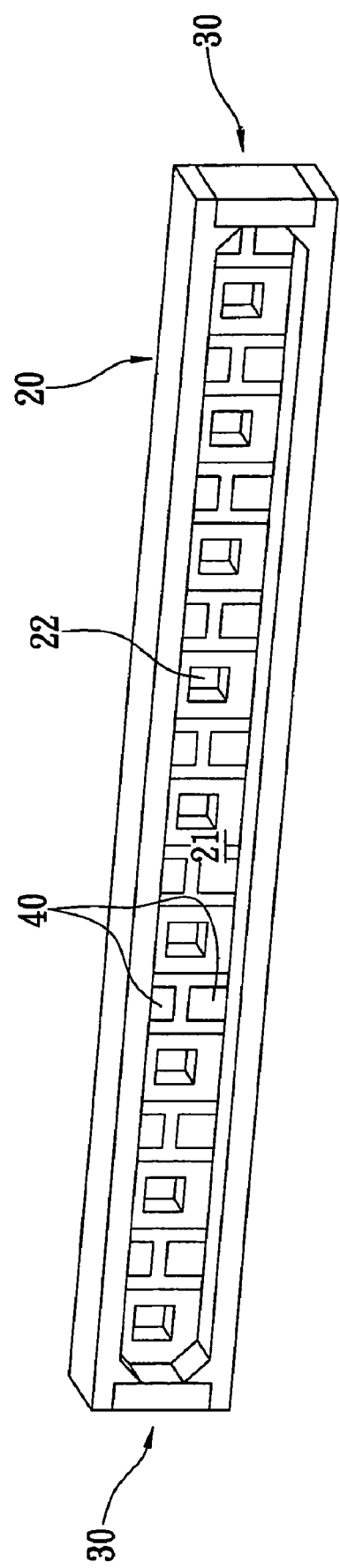
FIG. 3 is a perspective view of the present invention.
Figure 4:
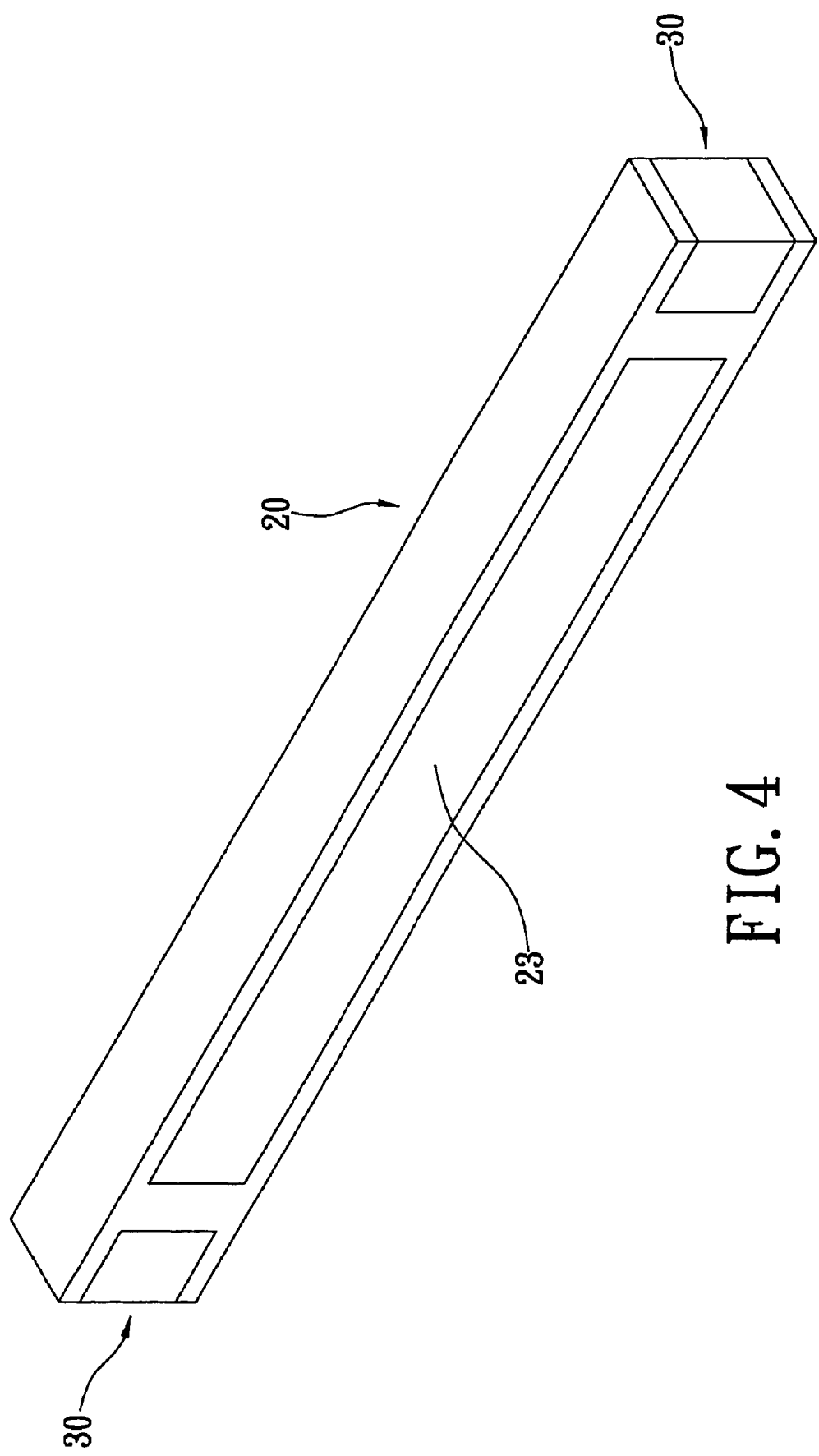
FIG. 4 is another perspective view of the present invention.

Reference is made to FIGS. 3 and 4, which show a high-powered diode holder of the present invention. The high-powered diode holder includes a base 20, and a plurality of metal electrodes 30.

The base 20 has a rectangular shape. It can be a rectangle, a rectangular polygon, or an arc polygon. The base 20 is made of ceramic. At one end of the base 20, there is a functional area 21 that is indented inwards. In the functional area 21, there are a plurality of through-hole units 22 that are equidistant from each other. The through-hole unit 22 can be a single through-hole type or is composed of a plurality of small through holes. In this embodiment, the through-hole unit 22 belongs to the single through-hole type. The second end of the base 20 is connected with a heat-conducting base 23 that is made of metal materials.

The present invention utilizes two metal electrodes 30. The metal electrodes 30 are made of conducting metal materials, such as copper. The two metal electrodes 30 are individually connected with two sides of the base 20. In the functional area 21 of the base 20, there are a plurality of conducting areas 40 disposed in two rows and at the same distance from each other. The conducting areas 40 are made of conducting metal materials. The two metal electrodes 30 are electrically connected with corresponding conducting areas 40. In other words, one metal electrode 30 is electrically connected with one row of conducting areas 40, and another metal electrode 30 is electrically connected with another row of conducting areas 40. When a positive voltage and a negative voltage are exerted on the two metal electrodes 30, a positive polarity and a negative polarity will be generated on the separated conducting areas 40.

The metal electrode 30 electrically connected with the conducting area 40 can be implemented by circuit. Alternatively, the metal electrode 30 is integrated with the conducting area 40 into one piece.

Figure 5:
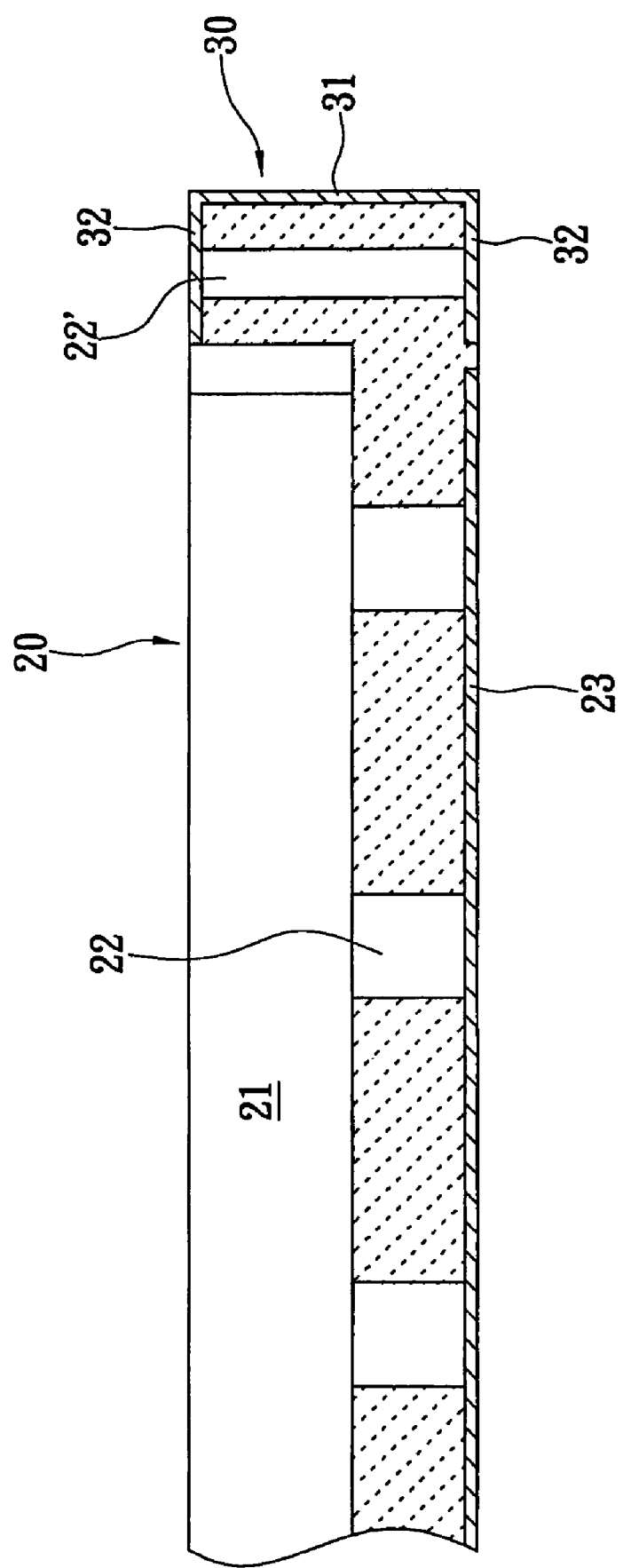
FIG. 5 is a partial cross-sectional view of the present invention.

As shown in FIG. 5, each of the two metal electrodes 30 has an electrode base portion 31, and two electrode side portions 32 extending from two sides of the electrode base portion 31. The electrode base portions 31 are connected with the left, and right sides of the base 20. The two electrode side portions 32 are connected with the top and bottom surfaces of the base 20. Furthermore, on the left, and right sides of the base 20, there is a second through-hole unit 22' that is located between the two electrode side portions 32.

Figure 6:
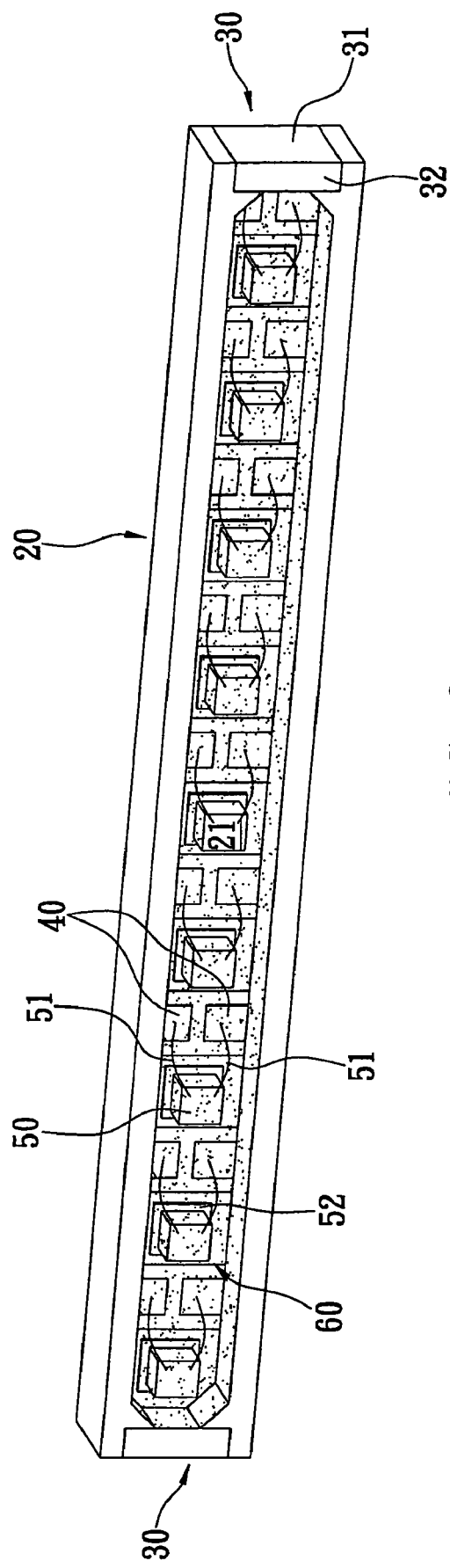
FIG. 6 is a perspective view of the present invention connected with LED chips.
Figure 7:
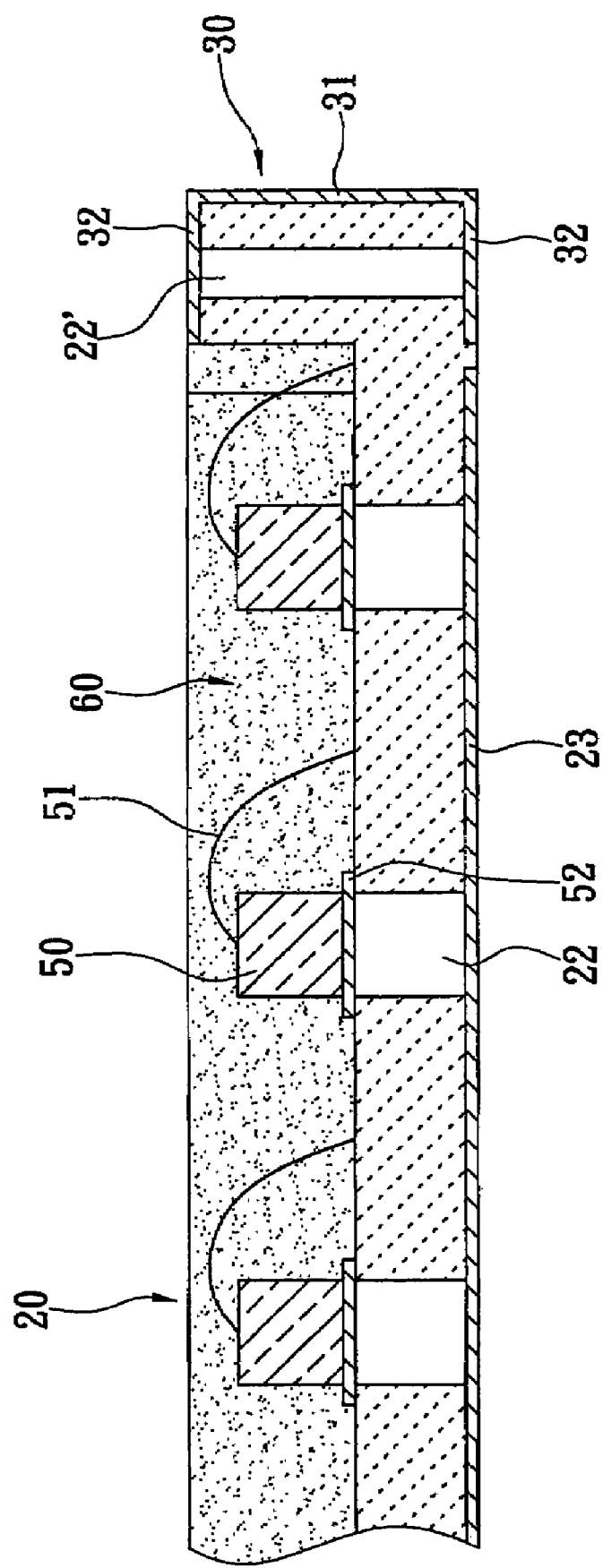
FIG. 7 is a partial cross-sectional view of the present invention connected with LED chips.

Reference is made to FIGS. 6 and 7, which show the high-powered diode package structure of the present invention. In the functional area 21, there are a plurality of LED chips 50 disposed at the same distance from each other. The LED chips 50 correspond to the through-hole units 22. Each of the LED chips 50 is connected with the corresponding conducting areas 40 via two conducting-wires 51 (they can be gold wires). The color of the light from the LED chips 50 is not limited to a specific one and depends on requirements.

The bottom of the LED chip 50 is further connected with a metal pad 52 that is pasted on the base 20 and corresponds to the through-hole unit 22. The dimension of the metal pad 52 is larger than that of the through-hole unit 22.

A layer of transparent package resin element 60 covers the functional area 21 of the base 20 to package the LED chip 50 and the conducting-wires 51 so as to prevent vapor from damaging the LED chip 50. The package resin element 60 can be epoxy resin, silica gel, or other known heat-molded resins. The package resin element 60 can be further mixed with a phosphor powder, such as a yellow phosphor powder, to change the color of light emitting from the LED chip 50.

When the positive voltage and the negative voltage are individually exerted to the two metal electrodes 30, the voltages are conducted to the conducting areas 40 via the conducting-wire 51 to make the LED chip 50 emit light. When the voltage is exerted, the LED chips 50 generate heat, and the heat can be conducted to the through-hole units 22 via the metal pads 52, and then passed on to the heat-conducting base 23. At the same time, because the base 20 is made of ceramic and is heatproof, durable, and opaque, it will not deteriorate due to high temperature. It is thinner and prevents the light from leaking.

Figure 8:
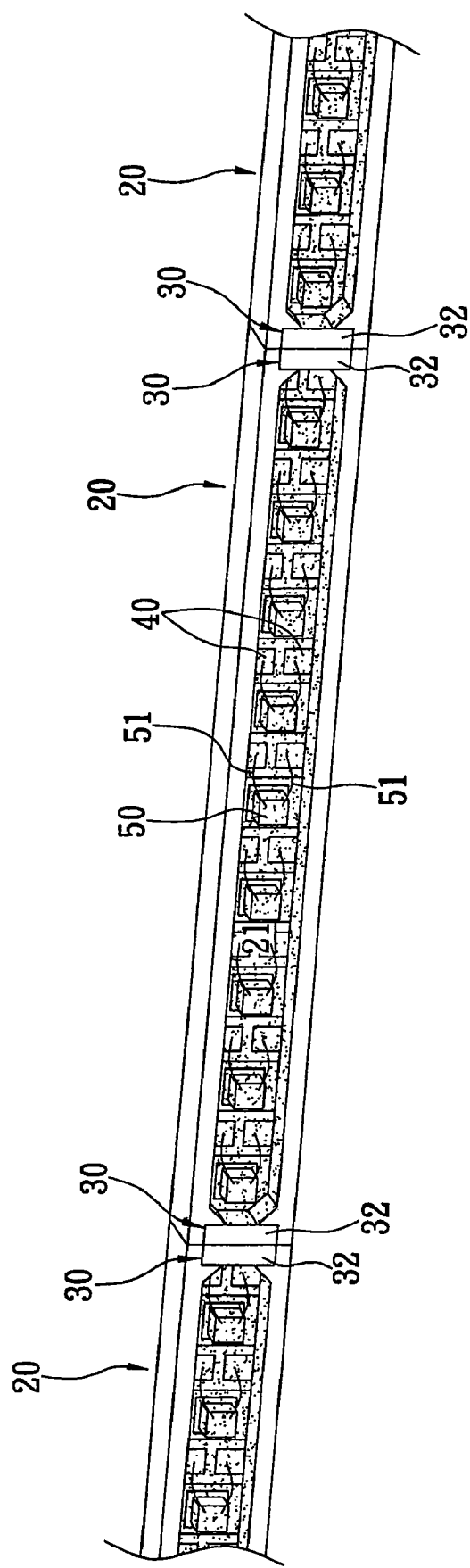
FIG. 8 is a perspective view of the present invention connected together in serial.
Figure 9:
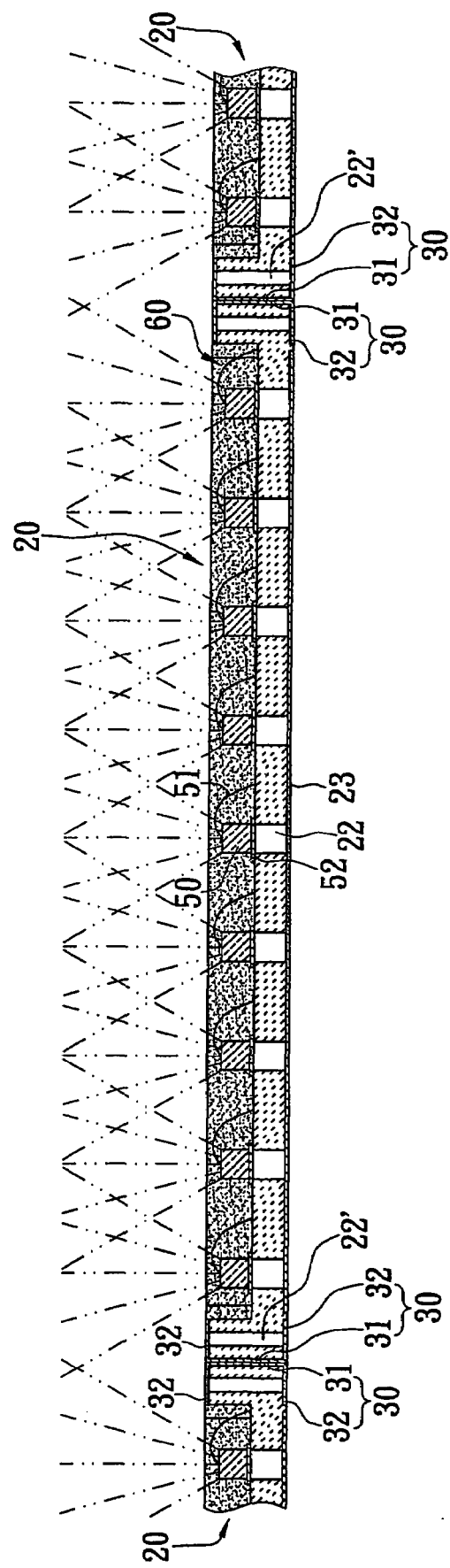
FIG. 9 is a partial cross-sectional view of the present invention connected together in serial.

Reference is made to FIGS. 8 and 9, which show the high-powered diode package assembly of the present invention. In this embodiment, the described plurality of high-powered diode package structures are included and are connected together in serial. In the figures, there are three high-powered diode package structures. The left side and the right side of one base 20 are respectively connected with another two bases 20 in serial. Thereby, two metal electrodes 30 of the base 20 are respectively adjacent to or electrically contacting one metal electrode 30 of the two serial bases 20. In detail, the electrode base portion 31 of one metal electrode 30 of the base 20 electrically contacts the electrode base portion 31 of one metal electrode 30 of another base 20.

When the positive voltage and the negative voltage are individually exerted to the two metal electrodes 30 in a rowing method (such as positive polarity, negative polarity, positive polarity, negative polarity, etc.) the LED chips 50 located in the bases 20 emit the light simultaneously. Thereby, the structure of the LED packages being connected in serial shortens the distance between the two adjacent LED packages 50 in the bases 20 so as to prevent light-spots from occurring. The total brightness is balanced.

The present invention has the following characteristics:

1. The base is made of ceramic that is heatproof, durable, and opaque. It will not deteriorate due to high temperature. It is thinner and prevents the light from leaking.

2. The structure of the through-hole and heat-conducting base makes the LED chips conduct heat well.

3. The structure of the LED packages being connected in serial shortens the distance between two adjacent LED packages and prevents the light-spots from occurring. The total brightness is balanced.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A high-powered diode holder, comprising:
   a base made of ceramic, wherein a functional area that is inwardly recessed is located in an interior part of one face of the base, the functional area of the base has a plurality of through-hole units and a plurality of conducting areas in each of two rows, the conducting areas of one row having a different polarity than the conducting areas of the other row, the plurality of through-hole units each including a hole formed through the base, and the base having an opposing second face connected with a metallic heat-conducting base, the heat-conducting base overlaying the plurality of holes of the plurality of through-hole units on the second face;

a plurality of metal pads respectively overlaying the plurality of holes of the plurality of through-hole units for receiving LED chips thereon; and a pair of metal electrodes respectively connected on opposing end portions of the base, wherein each metal electrode is electrically connected with a respective one of the rows of conducting areas.

2. The high-powered diode holder as claimed in claim 1, wherein the base is rectangular.

3. The high-powered diode holder as claimed in claim 1, wherein each of the metal electrodes has an electrode base portion disposed on an end of the base, and two electrode side portions extending from two sides of the electrode base portion on the opposing first and second faces of the base.

4. The high-powered diode holder as claimed in claim 3, wherein the base has a pair of second holes formed through the opposing first and second faces of the base respectively disposed adjacent opposing ends of the base, each of the second holes being overlaid by the electrode side portions of a corresponding one of the metal electrodes.

5. A high-powered diode holder, comprising:
a base made of ceramic, wherein a functional area that is inwardly recessed is located in an interior part of one face of the base, the functional area of the base has a plurality of through-hole units and a plurality of conducting areas in each of two rows, the conducting areas of one row having a different polarity than the conducting areas of the other row, the plurality of through-hole units each including a hole formed through the base, and the base having an opposing second face connected with a metallic heat-conducting base, the heat-conducting base overlaying the plurality of holes of the plurality of through-hole units on the second face;

a pair of metal electrodes respectively connected on opposing end portions of the base, wherein each metal electrode is electrically connected with a respective one of the rows of conducting areas;

a plurality of metal pads disposed in the functional area and respectively overlaying the plurality of holes of the plurality of through-hole units:

a plurality of LED chips located in the functional area of the base and respectively mounted on the metal pads, wherein the LED chips are respectively connected to the conducting areas with conducting-wires; and a package resin element disposed in the functional area of the base and covering the LED chips.

6. The high-powered diode holder as claimed in claim 5, wherein the base is rectangular.

7. The high-powered diode holder as claimed in claim 5, wherein each of the metal electrodes has an electrode base portion disposed on an end of the base, and two electrode side portions extending from two sides of the electrode base portion on the opposing first and second faces of the base.

8. The high-powered diode holder as claimed in claim 7, wherein the base has a pair of second holes formed through the opposing first and second faces of the base respectively disposed adjacent opposing ends of the base, each of the second holes being overlaid by the electrode side portions of a corresponding one of the metal electrodes.

9. The high-powered diode holder as claimed in claim 5, wherein the package resin element is epoxy resin or silica gel.

10. The high-powered diode holder as claimed in claim 5, wherein the package resin element is further mixed with phosphor powder.

11. A high-powered diode package assembly comprising a plurality of diode packages that are connected in series, each diode package including:
a base having a rectangular contour and being made of a ceramic material, wherein a functional area that is inwardly recessed is located in an interior part of one face of the base, the functional area of the base has a plurality of through-hole units and a plurality of conducting areas in each of two rows, the conducting areas of one row having a different polarity than the conducting areas of the other row, the plurality of through-hole units each including a hole formed through the base, and the base having an opposing second face connected with a metallic heat-conducting base, the heat-conducting base overlaying the plurality of holes of the plurality of through-hole units on the second face;

two metal electrodes respectively connected on opposing end portions of the base, wherein each metal electrode is electrically connected with a respective one of the rows of conducting areas a plurality of metal pads disposed in the functional area and respectively overlaying the plurality of holes of the plurality of through-hole units;

a plurality of LED chips located in the functional area of the base and respectively mounted on the metal pads, wherein the LED chips are respectively connected to the conducting areas with conducting-wires; and a package resin element disposed in the functional area of the base and covering the LED chips;

the plurality of diode packages being connected together in series in end-to-end relationship, the electrode base portion of one metal electrode of one of the diode packages being in contiguous contact and electrically connected with the electrode base portion of one metal electrode of an adjacent one of the diode packages.

12. The high-powered diode package assembly as claimed in claim 11, wherein each of the metal electrodes has an electrode base portion disposed on an end of the base, and two electrode side portions extending from two sides of the electrode base portion on the opposing first and second faces of the base.

13. The high-powered diode package assembly as claimed in claim 12, wherein the base has a pair of second holes formed through the opposing first and second faces of the base respectively disposed adjacent opposing ends of the base, each of the second holes being overlaid by the electrode side portions of a corresponding one of the metal electrodes.

14. The high-powered diode package assembly as claimed in claim 11, wherein the package resin element is epoxy resin or silica gel.

15. The high-powered diode package assembly as claimed in claim 11, wherein the package resin element is further mixed with phosphor powder.

* * * * *